United States Patent
Xian et al.

(10) Patent No.: US 10,546,879 B2
(45) Date of Patent: Jan. 28, 2020

(54) ARRAY SUBSTRATE AND DISPLAY DEVICE

(71) Applicant: BOE Technology Group Co., Ltd., Beijing (CN)

(72) Inventors: Jianbo Xian, Beijing (CN); Pan Li, Beijing (CN); Jian Xu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 15/750,984

(22) PCT Filed: Jul. 11, 2017

(86) PCT No.: PCT/CN2017/092488
§ 371 (c)(1),
(2) Date: Feb. 7, 2018

(87) PCT Pub. No.: WO2018/068542
PCT Pub. Date: Apr. 19, 2018

(65) Prior Publication Data
US 2019/0267400 A1    Aug. 29, 2019

(30) Foreign Application Priority Data
Oct. 14, 2016   (CN) ...................... 2016 2 1126476 U

(51) Int. Cl.
*H01L 27/00* (2006.01)
*H01L 27/12* (2006.01)
(Continued)

(52) U.S. Cl.
CPC ...... *H01L 27/124* (2013.01); *G02F 1/134363* (2013.01); *G02F 1/136286* (2013.01)

(58) Field of Classification Search
None
See application file for complete search history.

(56) References Cited

U.S. PATENT DOCUMENTS 7,936,331 B2 *  5/2011  Uh .......................... G11C 19/28
                                                        345/100
7,969,402 B2 *  6/2011  Lee ...................... G09G 3/3677
                                                        345/100
(Continued)

FOREIGN PATENT DOCUMENTS

CN        1514294 A        7/2004
CN       202159214 U       3/2012
(Continued)

OTHER PUBLICATIONS

International Search Report and Written Opinion for International Application No. PCT/CN2017/092488, dated Aug. 30, 2017, 14 pages.
(Continued)

*Primary Examiner* — Evren Seven
(74) *Attorney, Agent, or Firm* — Westman, Champlin & Koehler, P.A.

(57) ABSTRACT

Embodiments of the present disclosure provide an array substrate and a display device. The array substrate has a display area and a non-display area and includes: a base substrate; a plurality of pixel units arranged in the display area on the base substrate and each comprising a common electrode and a pixel electrode; and a common electrode leading-out line provided in the non-display area on the base substrate; common electrodes of at least one row and/or column of pixel units are connected with one another and with the common electrode leading-out line.

19 Claims, 7 Drawing Sheets

(51) Int. Cl.
*G02F 1/1343* (2006.01)
*G02F 1/1362* (2006.01)

(56) References Cited

U.S. PATENT DOCUMENTS

| | | | | |
|---|---|---|---|---|
| 8,310,471 | B2* | 11/2012 | Kamio | G02F 1/134336 |
| | | | | 345/204 |
| 2004/0125256 | A1 | 7/2004 | Park et al. | |
| 2005/0001805 | A1* | 1/2005 | Jeon | G02F 1/136286 |
| | | | | 345/92 |
| 2015/0042692 | A1* | 2/2015 | Kim | G09G 3/3233 |
| | | | | 345/690 |
| 2017/0090256 | A1* | 3/2017 | Miyamoto | G02F 1/13306 |
| 2017/0205676 | A1* | 7/2017 | Li | G02F 1/1368 |
| 2017/0278868 | A1* | 9/2017 | Tian | G02F 1/136286 |
| 2017/0299907 | A1* | 10/2017 | Zhao | H01L 27/1259 |
| 2017/0345845 | A1* | 11/2017 | Wu | G09G 3/3677 |
| 2018/0101077 | A1* | 4/2018 | Xu | G09G 3/3688 |
| 2019/0051593 | A1* | 2/2019 | Kimura | H01L 23/49838 |
| 2019/0079331 | A1* | 3/2019 | Miyamoto | H01L 29/41733 |
| 2019/0096914 | A1* | 3/2019 | Hosokawa | H01L 27/124 |
| 2019/0131320 | A1* | 5/2019 | Shin | H01L 27/124 |
| 2019/0137808 | A1* | 5/2019 | Koide | G02F 1/13458 |

FOREIGN PATENT DOCUMENTS

| | | |
|---|---|---|
| CN | 206074968 U | 4/2017 |
| JP | H09-80470 A | 3/1997 |
| JP | 2003-207802 A | 7/2003 |

OTHER PUBLICATIONS

English translation of International Search Report and Written Opinion for International Application No. PCT/CN2017/092488, dated Aug. 30, 2017, 16 pages.

* cited by examiner

ARRAY SUBSTRATE AND DISPLAY DEVICE

CROSS-REFERENCE TO RELATED APPLICATION

This application is a Section 371 National Stage Application of International Application No. PCT/CN2017/092488, filed Nov. 7, 2017, which is not yet published, and claims the benefit of Chinese Patent Application No. 201621126476.0 filed on Oct. 14, 2016 in the State Intellectual Property Office of China, the disclosures of which are incorporated in entirety herein by reference.

BACKGROUND

Technical Field

Embodiments of the present disclosure generally relate to a field of display technology, and particularly, to an array substrate and a display device.

Description of the Related Art

In a current liquid crystal display, there are various instances for arrangement of a common electrode in a display panel, including one instance where the common electrode and a pixel electrode are both provided on an array substrate, for example, in an Advanced-Super Dimensional Switching (ADS) technique. In the ADS technique, there is formed a multidimensional electric field including an electric field generated at an edge of a slit electrode in a plane and an electric field generated between a slit electrode layer and a plate electrode layer, such that liquid crystal molecules in all orientations between slit electrodes and directly above the electrode can be rotated.

In a conventional array substrate where the ADS technique is adopted, a common electrode located in a display area is connected with a common electrode leading-out line located in a non-display area by a common electrode line, so that it is required to provide a via hole for connecting each common electrode with the common electrode line.

SUMMARY

In order to overcome at least one of problems and defects in prior arts, the present disclosure is made.

In an aspect, an embodiment of the present disclosure provides an array substrate, having a display area and a non-display area and comprising:
a base substrate;
a plurality of pixel units arranged in the display area on the base substrate and each comprising a common electrode and a pixel electrode; and
a common electrode leading-out line provided in the non-display area on the base substrate;
common electrodes of at least one row and/or at least one column of pixel units are connected with one another and connected with the common electrode leading-out line.

In one embodiment, the array substrate further comprises a common electrode connection line provided on the base substrate to interconnect the common electrodes of at least one row and/or at least one column of pixel units, and connected with the common electrode leading-out line.

In one embodiment, the common electrode and the common electrode connection line are provided in a same layer.

In one embodiment, the array substrate further comprises a common electrode line provided on the base substrate and electrically connected with a corresponding common electrode, the common electrode line being connected with the common electrode leading-out line.

In one embodiment, the common electrode leading-out line and the common electrode connection line are provided in different layers and the common electrode connection line is connected with the common electrode leading-out line through a first via hole; and/or the common electrode leading-out line and the common electrode line are provided in different layers and the common electrode line is connected with the common electrode leading-out line through a second via hole.

In one embodiment, an orthographic projection of the first via hole on the base substrate at least partially overlaps an orthographic projection of the second via hole on the base substrate.

In one embodiment, an orthographic projection of the first via hole on the base substrate covers an orthographic projection of the second via hole on the base substrate.

In one embodiment, each row of pixel units comprises a plurality of pixel unit groups each comprising at least two pixel units, and common electrodes of the at least one pixel units of each pixel unit group is connected with the common electrode line through a third via hole.

In one embodiment, the common electrodes of the at least two pixel units of at least one pixel unit group are formed into a single plate-shaped structure.

In one embodiment, the common electrode connection line comprises a first sub-connection line in the display area and a second sub-connection line in the non-display area; the common electrode line comprises a third sub-connection line in the display area and a fourth sub-connection line in the non-display area; and the second sub-connection line, the fourth sub-connection line and the common electrode are arranged in a same layer.

In one embodiment, the common electrode connection line comprises a first sub-connection line in the display area and a second sub-connection line in the non-display area; the common electrode line comprises a third sub-connection line in the display area and a fourth sub-connection line in the non-display area; the second sub-connection line and the common electrode are arranged in a same layer; and the fourth sub-connection line and the pixel electrode are arranged in a same layer.

In one embodiment, the pixel electrode is located above a plurality of data lines.

In one embodiment, each pixel unit is provided with at least one thin film transistor, a second passivation layer is provided between the plurality of data lines and the pixel electrode, and the pixel electrode is connected with a source electrode or drain electrode of at least one said thin film transistor through a fourth via hole.

In some embodiments, pixel electrodes of respective pixel units are arranged at an interval, and common electrodes of all pixel units are formed into a single plate-shaped structure; or pixel electrodes of respective pixel units are arranged at an interval, and common electrodes of respective pixel units are arranged at an interval.

In one embodiment, common electrodes of all pixel units are formed into a single plate-shaped structure provided in the display area or the non-display area, and the common electrode is lapped above or below the common electrode leading-out line in the non-display area so as to be connected with the common electrode leading-out line.

In one embodiment, the common electrode is located below the common electrode leading-out line, the pixel unit comprises a common electrode line electrically connected with a corresponding common electrode, and the common electrode line comprises a third sub-connection line in the display area and a fourth sub-connection line in the non-display area; and the fourth sub-connection line and the pixel electrode are arranged in a same layer.

In one embodiment, the common electrode is located above the common electrode leading-out line, the pixel unit comprises a common electrode line electrically connected with a corresponding common electrode, and the common electrode line comprises a third sub-connection line in the display area and a fourth sub-connection line in the non-display area; and the fourth sub-connection line and the common electrode are arranged in a same layer.

In one embodiment, the pixel electrode and the common electrode are located in a same layer.

In one embodiment, the common electrode line is provided in the same layer as the common electrode leading-out line and is directly lapped over and connected with the common electrode leading-out line.

In one embodiment, the common electrode comprises a slit structure corresponding to at least one of the pixel units in the display area; and/or the common electrode includes a hollowed-out structure lapping at least one of a gate line, a data line and a thin film transistor in the display area.

In another aspect, there is provided a display device, comprising the array substrate described in any one of the embodiments.

BRIEF DESCRIPTION OF THE DRAWINGS

In order to more clearly illustrate the technical solutions of the embodiments of the present disclosure, the drawings, which are used in the description of the embodiments, will be briefly described below. It will be apparent that the drawings in the following description only represent some embodiments of the present disclosure. Other drawings may be obtained by those skilled in the art according to these drawings without creative efforts.

DETAILED DESCRIPTION OF PREFERRED EMBODIMENTS

In order to more clearly provide the objectives, technical solutions and advantages of the embodiments of the present disclosure, embodiments of the present disclosure will be further described in detail below, with reference to the accompanying drawings.

Figure 1:
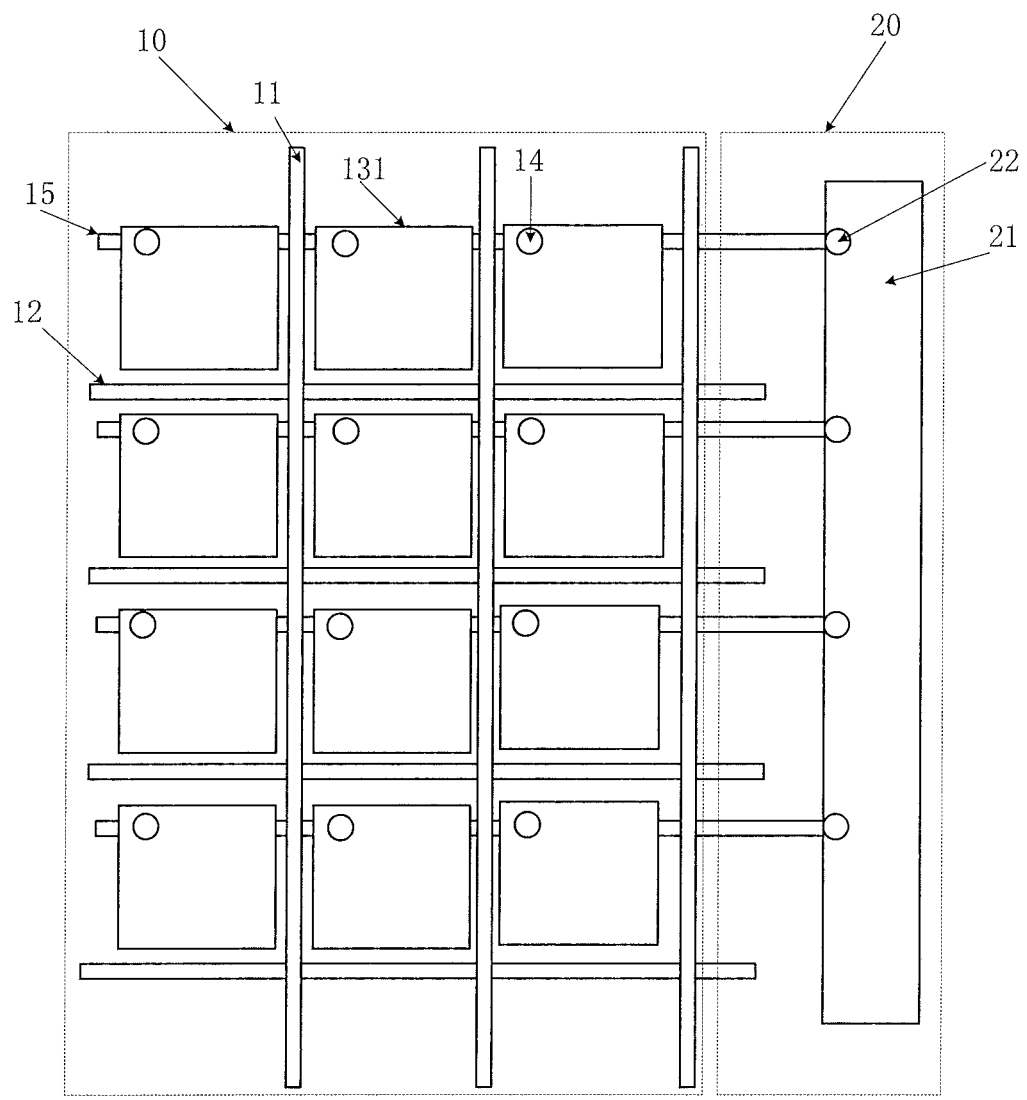
FIG. 1 is a plan view schematically showing an array substrate where the ADS technique is adopted.

Referring to FIG. 1, FIG. 1 is an array substrate implementing the ADS technique, where the array substrate comprises a display area 10 and a non-display area 20, a pixel unit is provided in a region of the display area 10, which is defined by any two adjacent gate lines 12 and any two adjacent data lines 11, each pixel unit has a common electrode 131, each common electrode 131 is connected with a common electrode line 15 through a third via hole 14, and the common electrode line 15 extends from the display area 10 to the non-display area 20 and is connected with a common electrode leading-out line 21 through a second via hole 22.

Figure 2A:
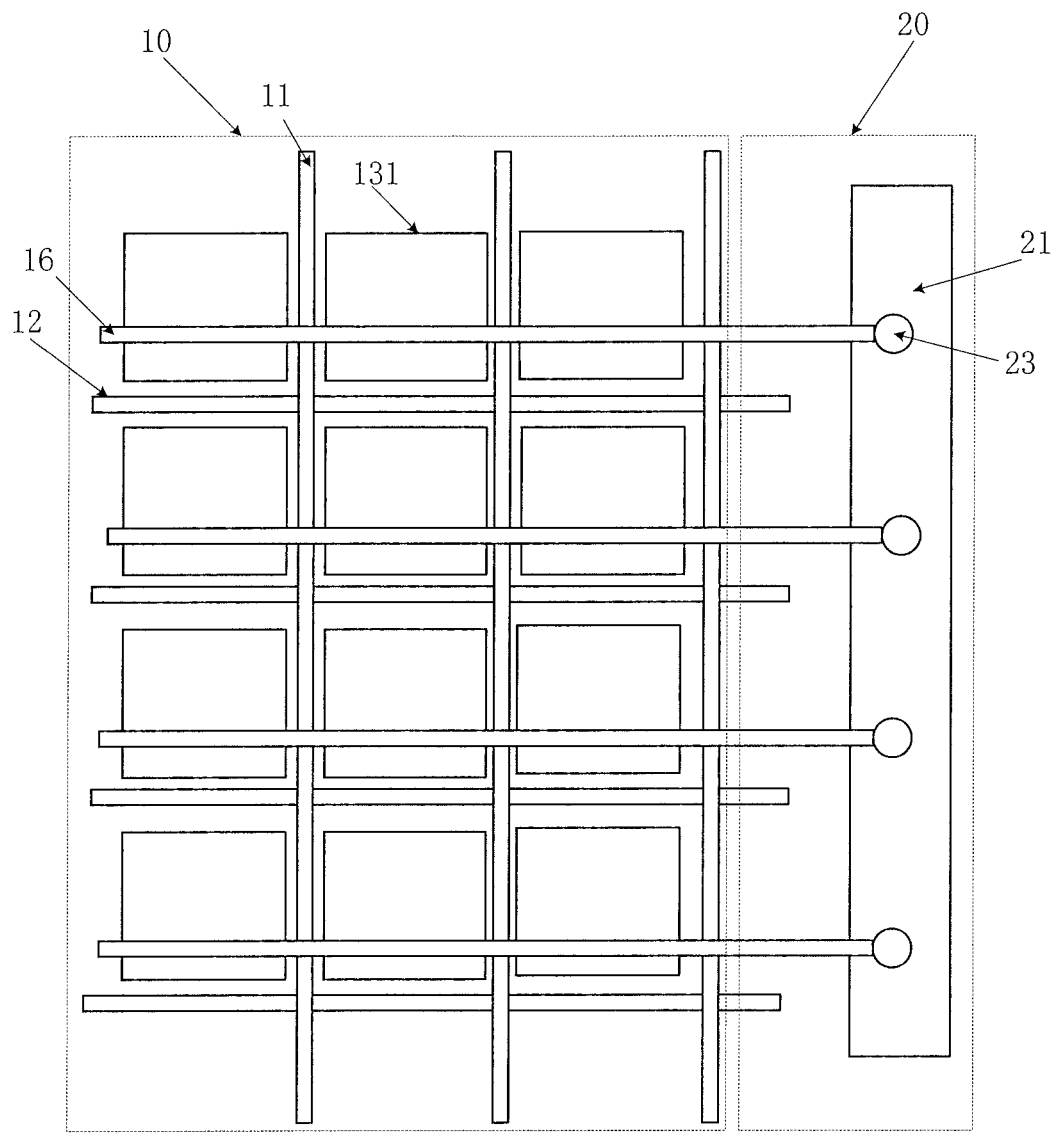
FIG. 2A is a structural schematic diagram of an array substrate according to an embodiment of the present disclosure.
Figure 4:
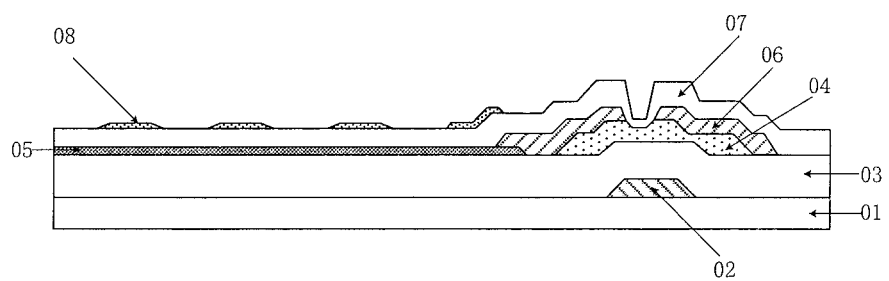
FIG. 4 is a sectional view schematically showing structure of film layers of a single pixel unit of an array substrate according to an embodiment of the present disclosure.
Figure 6:
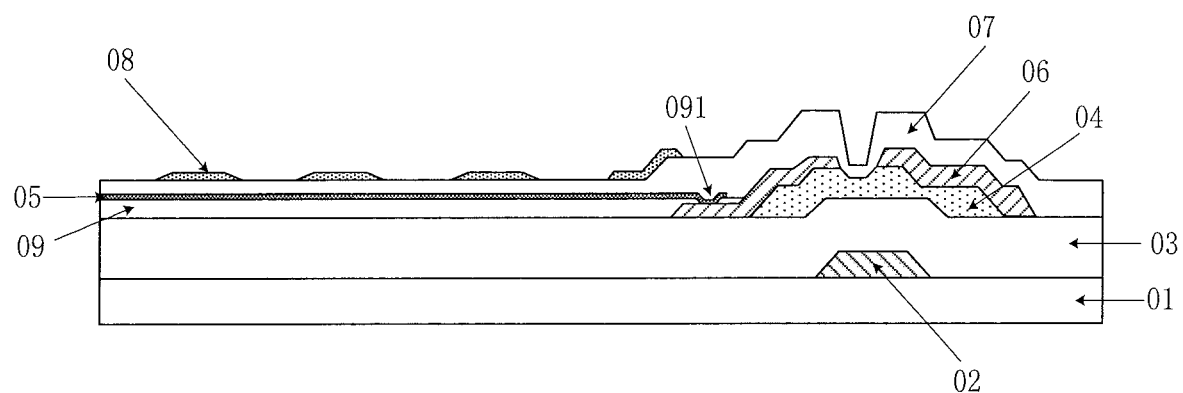
FIG. 6 is a sectional view schematically showing arrangement of film layers of a single pixel unit of an array substrate according to another embodiment of the present disclosure.
Figure 7:
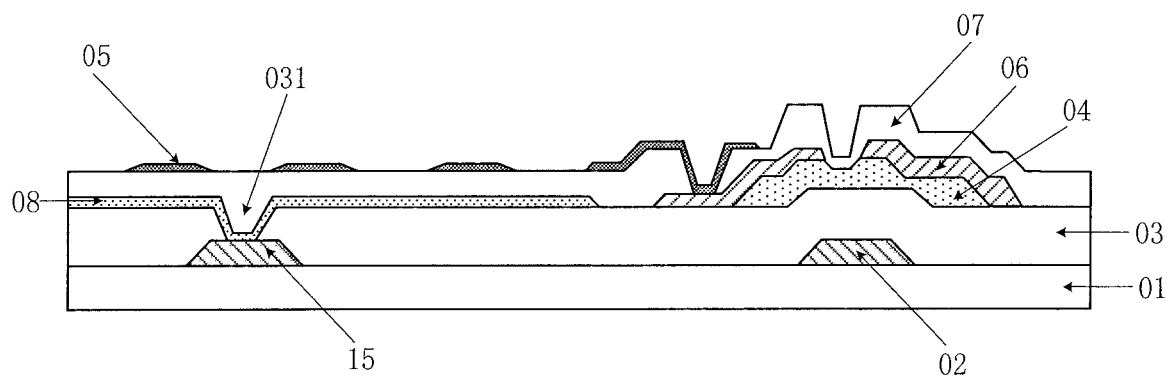
FIG. 7 is a sectional view schematically showing arrangement of film layers of a single pixel unit of an array substrate according to a further embodiment of the present disclosure.

FIG. 2A is a structural schematic diagram of an array substrate according to an embodiment of the present disclosure. The array substrate has a display area 10 and a non-display area 20, and comprises:

a base substrate (for example, referring to a base substrate 01 shown in FIG. 4, 6 or 7); and a plurality of pixel units arranged in the display area 10 on the base substrate and each comprising a common electrode 131 and a pixel electrode (for example, referring to a pixel electrode 05 shown in FIG. 4, 6 or 7). Exemplarily, the common electrode may be a block-shaped electrode. In some examples, common electrodes of respective pixel units may be arranged at an interval. As shown in FIG. 2A, the array substrate is further provided with a plurality of data lines 11 and a plurality of gate lines 12, and the pixel units are defined by the gate lines 12 and the data lines 11 crossing one another. For example, one pixel unit is provided in a region defined by any two adjacent gate lines 12 and any two adjacent data lines 11.

A common electrode leading-out line 21 is provided in the non-display area 20 on the base substrate.

In one embodiment, the common electrode leading-out line 21 may be parallel to the gate line 12 or the data line 11, and the common electrode leading-out line 21 is provided at one or both sides of the display area 10. FIG. 2A shows an example where the common electrode leading-out line 21 is parallel to the data line 11 and arranged at one side of the display area 10.

In one embodiment, as shown in FIG. 2A, a common electrode connection line 16 is provided on the base substrate, interconnects the common electrodes 131 of at least one row of pixel units and/or interconnects the common electrodes 131 of at least one column of pixel units, and connected with the common electrode leading-out line 21.

Figure 2B:
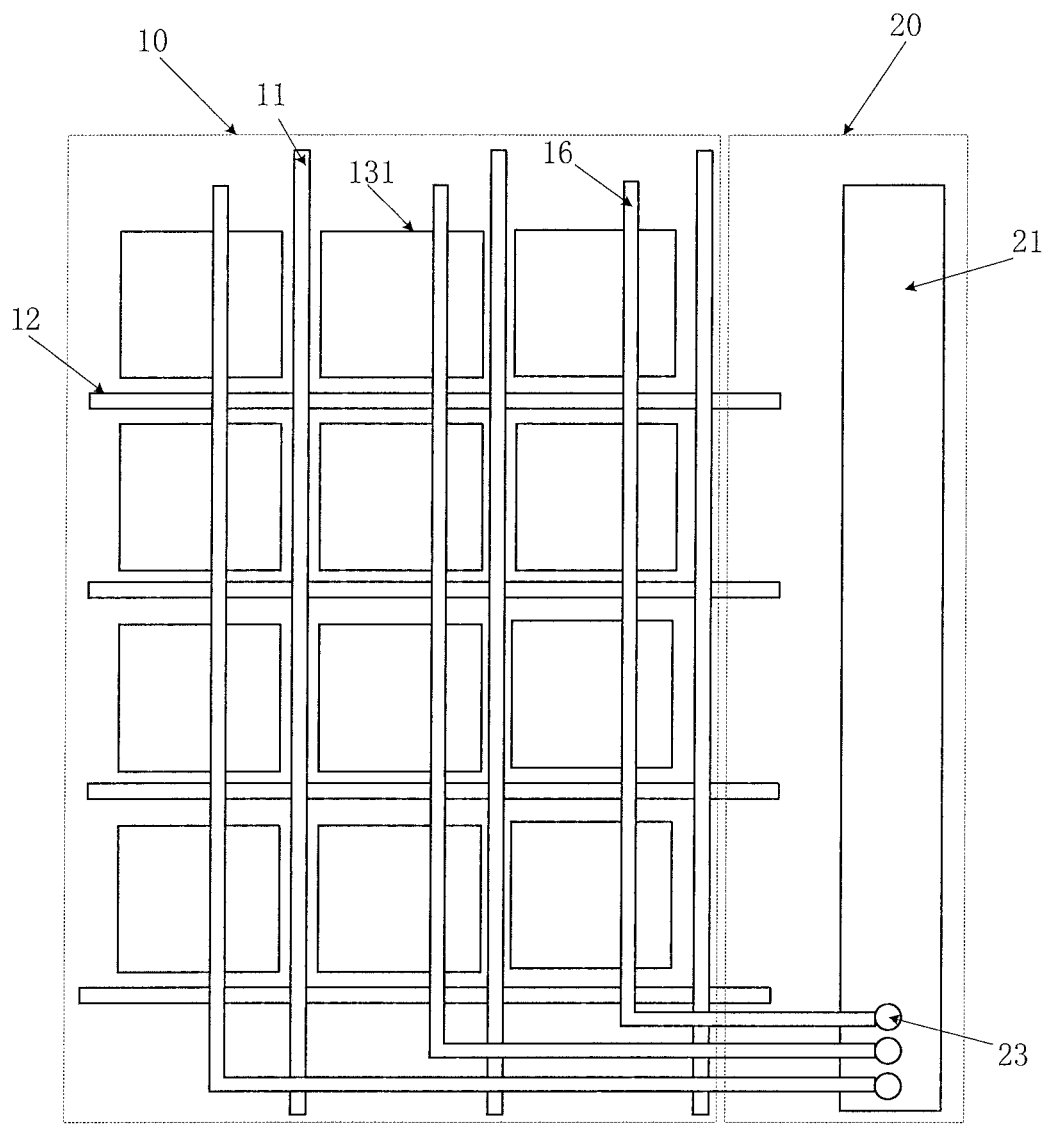
FIG. 2B is a structural schematic diagram of an array substrate according to another embodiment of the present disclosure.

Referring to FIG. 2A, FIG. 2A shows that in the array substrate, a common electrode connection line 16 may be provided to interconnect the common electrodes 131 of at least one row of pixel units; referring to FIG. 2B, FIG. 2B is a structural schematic diagram of an array substrate according to another embodiment of the present disclosure and shows that in the array substrate, a common electrode connection line 16 may be provided to interconnect the common electrodes 131 of at least one column of pixel units; in other embodiments of the present disclosure, in the array substrate, common electrode connection line(s) may be provided to interconnect the common electrodes of at least one column of pixel units and interconnect the common electrodes of at least one column of pixel units. For example, when the array substrate comprises 100 rows of and 90 columns of pixel units, a common electrode connection line may be provided to interconnect the common electrodes of one, two, three or more rows of pixel units, or a common electrode connection line may be provided to interconnect the common electrodes of one, two, three or more columns of pixel units, or a common electrode connection line may be provided to interconnect one row of pixel units with one column of pixel units.

In the array substrate according to embodiments of the present disclosure, the common electrode connection line is provided on the base substrate to interconnect at least one row of common electrodes and/or at least one column of common electrodes and connected with the common electrode leading-out line, enabling inputting of a voltage to the common electrode.

The inventors found that this array substrate not only provides a new connection way of connecting the common electrode with the common electrode leading-out line, but also has at least other advantages, for example: it is not necessary to provide any via hole for connecting each common electrode with the common electrode line or the number of the via hole may be reduced (for example, no via hole is required when no common electrode line is provided), thereby reducing process complexity, increasing transmittance of the display area, and optimizing a display effect of an image.

Figure 3A:
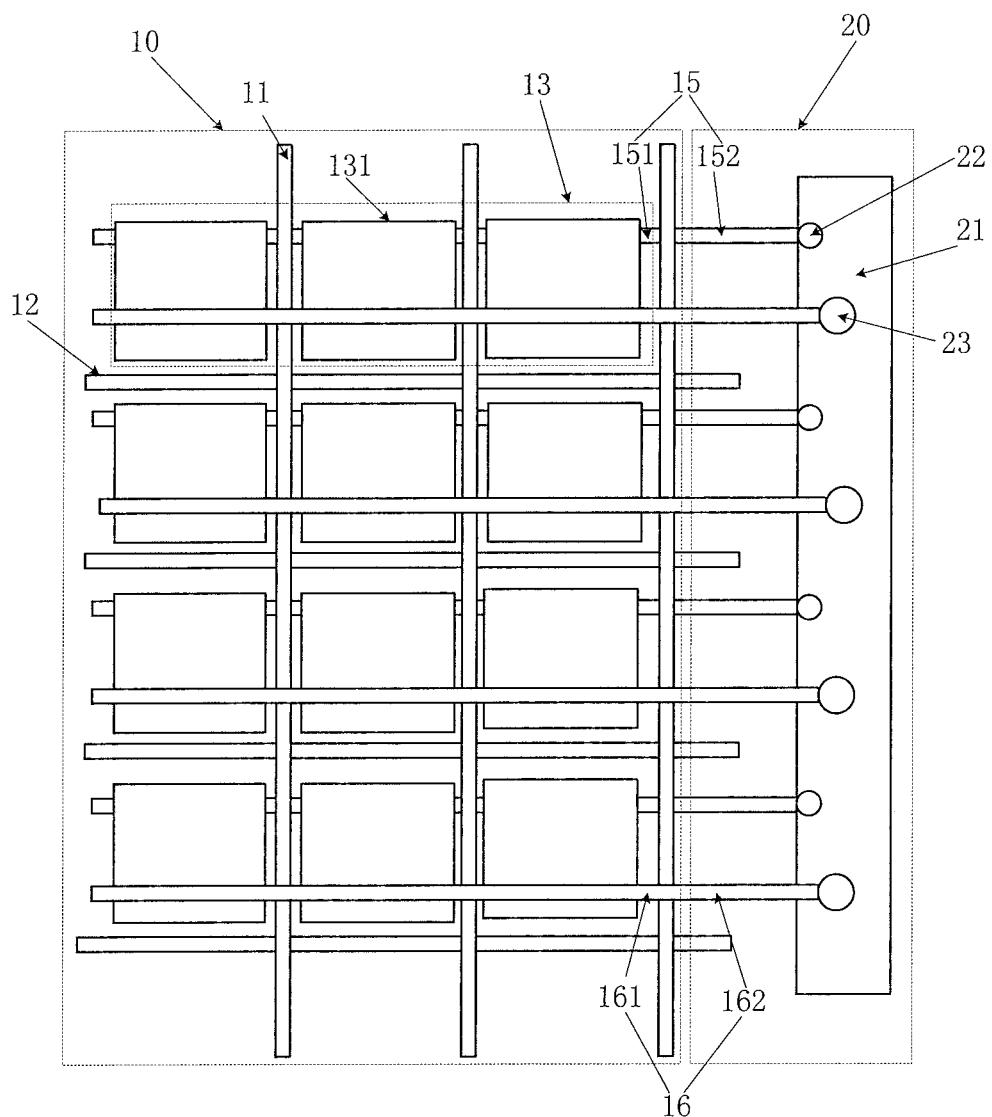
FIG. 3A is a structural schematic diagram of an array substrate according to a further embodiment of the present disclosure.

In one embodiment, referring to FIG. 3A, FIG. 3A is a structural schematic diagram of an array substrate according to a further embodiment of the present disclosure, where a common electrode line 15 may be provided on the base substrate and is connected with the common electrode leading-out line 21. FIG. 3A shows an example where the common electrode line 15 is parallel to the gate line 12. In practice, the common electrode line 15 may be also parallel to the data line 11.

In examples, the common electrode line may be connected with the common electrode leading-out line in various ways; when the common electrode line and the common electrode leading-out line are arranged in a same layer, the common electrode line may be directly electrically connected with the common electrode leading-out line; when the common electrode line and the common electrode leading-out line are arranged in different layers, the common electrode line is electrically connected with the common electrode leading-out line through a via hole.

In embodiments of the present disclosure, a voltage may be inputted to the common electrode through the common electrode connection line, and the common electrode line is formed on the base substrate and is electrically connected with the common electrode leading-out line, such that a storage capacitor may be formed between the common electrode line and the pixel electrode, facilitating improving charge retention of the pixel electrode and the display effect of an image.

In some embodiments, the common electrode and the common electrode connection line may be arranged in a same layer.

In embodiments of the present disclosure, there are various ways for arranging the common electrode connection line. In some examples, the common electrode connection line may be arranged in the same layer as the common electrode. For example, the common electrode connection line may be a part or integrated part of the common electrode, or the common electrode connection line is formed from a material layer forming the common electrode, and the common electrode connection line and the common electrode are formed into an integral structure, for example, the common electrode connection line may be a part directly extending from the common electrode in the display area to the non-display area. In some other examples, the common electrode connection line may be formed on the base substrate formed with the common electrode, such that the common electrode connection line is in direct contact with or is lapped over and connected with the common electrode. Thereby, in the display area, the common electrode connection line and the common electrode may be electrically connected with each other without using any via hole, or there is no need to provide any via hole for achieving an electrical connection between the common electrode connection line and the common electrode, this may, for example, may reduce process complexity, increase transmittance of the display area and optimize the display effect of an image.

In one embodiment, referring to FIG. 3A and FIG. 4, FIG. 4 is a sectional view schematically showing structure of film layers of a single pixel unit of an array substrate according to an embodiment of the present disclosure, where the array substrate may comprise: a base substrate 01, a gate electrode 02, a gate insulation layer 03, an active layer 04, a pixel electrode 05, a source-drain electrode pattern 06, a first passivation layer 07 and a common electrode 08. The common electrode leading-out line 21 and at least one of the common electrode line 15 and the common electrode connection line 16 may be not arranged in a same layer or be arranged in different layers. For example, the common electrode leading-out line 21 and the source-drain electrode pattern 06 may be arranged in a same layer, the common electrode line 15 and the gate electrode 02 may be arranged in a same layer, and the common electrode connection line 16 and the common electrode 08 may be arranged in a same layer. In some embodiments of the present disclosure, the common electrode connection line 16 may be provided on the base substrate 01 to electrically interconnecting common electrodes 131 in respective row of common electrodes 131 and to be connected with the common electrode leading-out line 21; each common electrode connection line 16 is electrically connected with the common electrode leading-out line 21 through a first via hole 23 provided in the first passivation layer 07; and each common electrode line 15 is electrically connected with the common electrode leading-out line 21 through a second via hole 22 provided in the gate insulation layer 03.

In one embodiment, an orthographic projection of the first via hole on the base substrate may at least partially overlap an orthographic projection of the second via hole on the base substrate.

In one embodiment, the orthographic projection of the first via hole on the base substrate may cover the orthographic projection of the second via hole on the base substrate.

In one embodiment, the orthographic projection of the first via hole on the base substrate may not overlap the orthographic projection of the second via hole on the base substrate.

Overlapping or non-overlapping of the orthographic projections of the first via hole and the second via hole onto the base substrate will not particularly limited in embodiments of the present disclosure.

Figure 5:
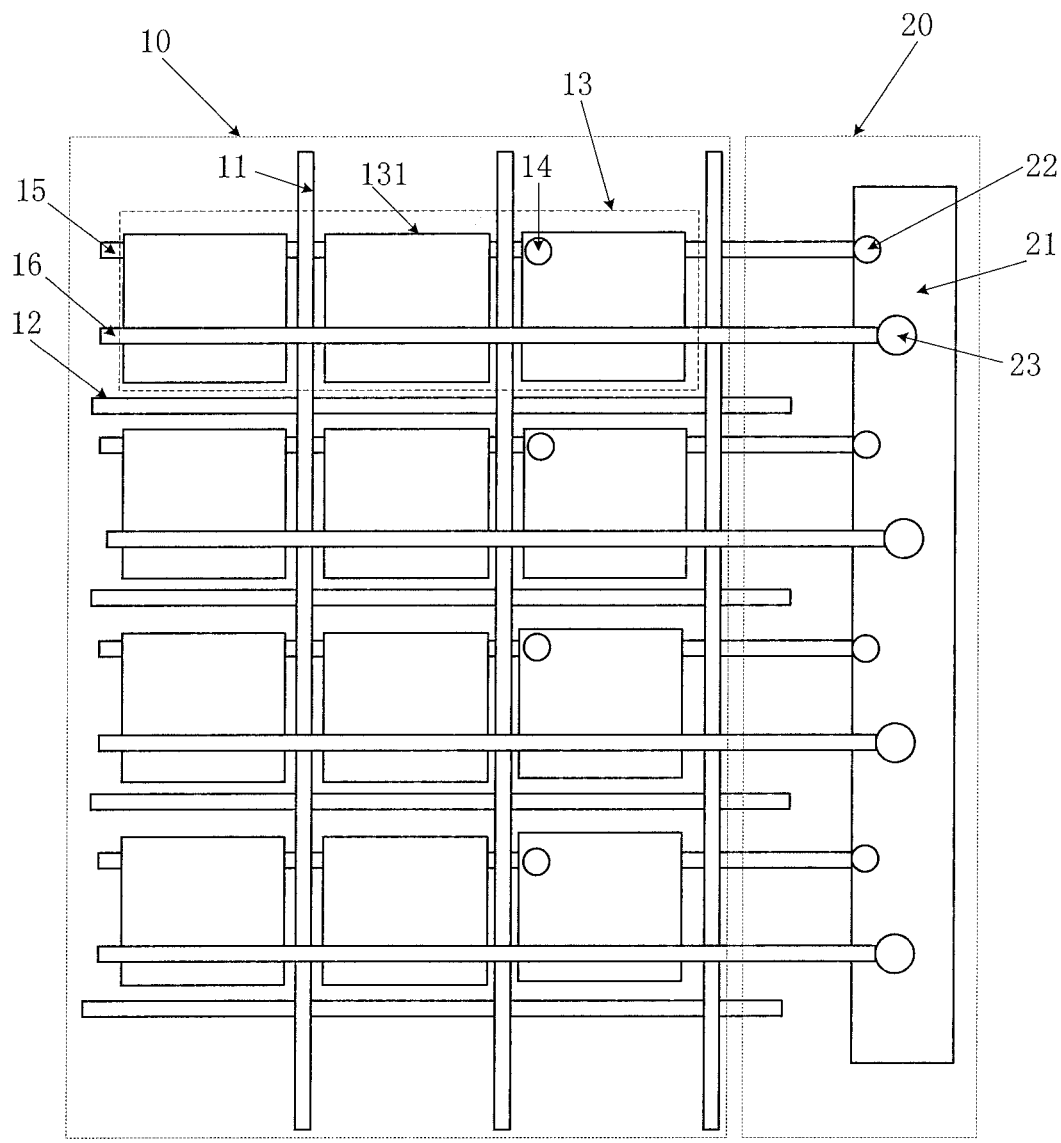
FIG. 5 is a structural schematic diagram of an array substrate according to a yet another embodiment of the present disclosure.

In one embodiment, referring to FIG. 5, FIG. 5 is a structural schematic diagram of an array substrate according to a yet another embodiment of the present disclosure, where each row of pixel unit comprises a plurality of pixel unit groups 13, and each pixel unit group 13 (indicated by a dashed box) comprises at least two pixel units, for example, the pixel unit group 13 comprises three pixel units when a display screen manufactured from the array substrate is a three-primary color display screen. The common electrodes 131 of the at least one pixel units of each pixel unit group 13 is electrically connected with the common electrode line 15 through third via holes 14. In embodiments of the present disclosure, the third via hole is provided such that the common electrode line and the common electrode connection line are both electrically connected with the common electrode, thereby enabling a better stability in voltage of the common electrode. Meanwhile, if one of the common electrode line and the common electrode connection line is damaged, a voltage may be inputted to the common electrode through the other one.

In practice, when the pixel unit group comprises three pixel units, for example, the three pixel units includes a red pixel unit, a green pixel unit and a blue pixel unit, the third via hole may only provided in a region where the blue pixel unit is located so as to electrically connect the common electrode with the common electrode line, in order to facilitate manufacturing of the array substrate.

In some embodiments of the present disclosure, in the display area, the common electrode corresponding to a single pixel unit may have a plate or block-shaped structure (for example, referring to the array substrate shown in FIG. 3A) or a slit structure or strip structure (for example, referring to the array substrate shown in FIG. 4).

In one embodiment, each row of pixel unit group comprises at least two pixel units, and common electrodes of the at least two pixel units are formed into a single plate or block-shaped structure, thereby a patterning process of forming the common electrode may be simplified.

Figure 3B:
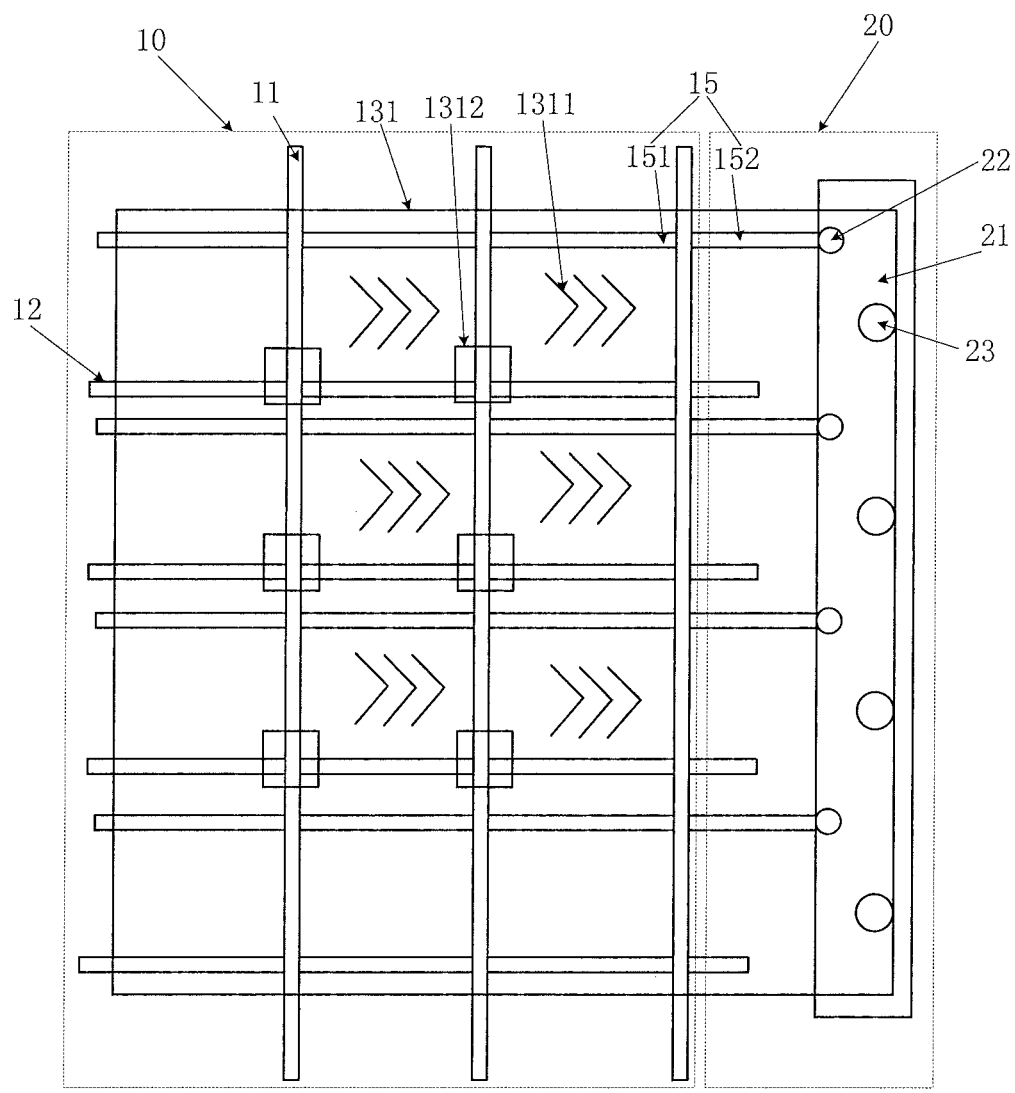
FIG. 3B is a structural schematic diagram of an array substrate according to a still further embodiment of the present disclosure.

In some embodiments, the common electrodes may have an integral plate or-shaped structure in the display area and/or non-display area. In an embodiment where the common electrodes of respective pixel units are only provided in the display area and have a single-piece plate or block-shaped structure, a common electrode connection line is configured to connect the common electrode with the common electrode leading-out line. In an embodiment where the common electrode is provided in both of the display area and the non-display area and has a single-piece plate or block-shaped structure, referring to FIG. 3B, a structural schematic diagram of an array substrate according to a still further embodiment of the present disclosure is illustrated in FIG. 3B. In the embodiment, the common electrode 131 is electrically connected with the common electrode leading-out line 21 in the non-display area 20 through a first via hole 23, that is, a part of the common electrode 131 located in the non-display area 20 is electrically connected with the common electrode leading-out line 21 through the first via hole 23, and in this case, it is not required to provide any common electrode connection line. In one embodiment, as shown in FIG. 3B, the common electrode 131 may include a slit structure 1311 and/or a hollowed-out structure 1312, and the slit structure 1311 is corresponding to at least one pixel unit in the display area 10; the hollowed-out structure 1312 overlaps at least one of the gate line 12, the data lines 11, and the thin film transistor (for example, referring to FIG. 4, 6 or 7). The shape of the common electrode is not particularly limited in embodiments of the present disclosure.

In one embodiment, as shown in FIG. 3A, the common electrode connection line 16 includes a first sub-connection line 161 in the display area 10 and a second sub-connection line 162 in the non-display area 20; and the common electrode line 15 includes a third sub-connection line 151 in the display area 10 and a fourth sub-connection line 152 in the non-display area 20. In an example, the second sub-connection line 162, the fourth sub-connection line 152 and the common electrode 131 may be arranged in a same layer. In this case, the second sub-connection line 162 and the fourth sub-connection line 152 may be formed from a material layer forming the common electrode, so that the common electrode 131, the second sub-connection line 152 and the fourth sub-connection line 162 may be formed through a single patterning process. Of course, the first via hole 23 and the second via hole 22 may also be formed through a single patterning process, reducing the number of the patterning processes.

In an embodiment of the present disclosure, the second sub-connection line 162 and the common electrode 131 may be arranged in a same layer, the fourth sub-connection line 152 and the pixel electrode may be arranged in a same layer, the pixel electrode may be directly lapped over the source-drain electrode pattern so as to be electrically connected with the source-drain electrode pattern, and the common electrode leading-out line 21 may also be arranged in the same layer as the source-drain electrode pattern. When the fourth sub-connection line 152 is formed from the material layer forming the common electrode, the second via hole 22 is not required for electrically connecting the common electrode line 15 with the common electrode leading-out line 21, and rather, the common electrode line 15 may be directly lapped over the common electrode leading-out line 21 so as to be electrically connected with the common electrode leading-out line, thus the patterning processes may also be simplified.

Referring to FIG. 6, FIG. 6 is a sectional view schematically showing structure of film layers of a single pixel unit of an array substrate according to another embodiment of the present disclosure, where each pixel unit on the base substrate 01 may be provided with at least one thin film transistor (TFT), and data lines of the array substrate are arranged in the same layer as the source-drain electrode pattern 06. When the pixel electrode 05 of the array substrate is located above a plurality of data lines, that is, the pixel electrode 05 is located above the source-drain electrode pattern 06, a second passivation layer 09 may be provided between the plurality of data lines and the pixel electrode 05, and the pixel electrode 05 is electrically connected with a source electrode or a drain electrode of the source-drain electrode pattern 06 of at least one TFT through a fourth via hole 091 in the second passivation layer 09. In some examples, the common electrode 08 includes a slit structure.

The above array substrate is described with the common electrode being above the pixel electrode, and in embodiments of the present disclosure, the common electrode may also be located below the pixel electrode.

For example, referring to FIG. 7, FIG. 7 is a schematic diagram showing structure of film layers of a single pixel unit of an array substrate according to a further embodiment of the present disclosure, where the common electrode 08 of the pixel unit is located below the pixel electrode 05, and in this case the pixel electrode 05 may also have a slit structure. In some examples, pixel electrodes 05 of respective pixel units may be arranged at an interval, and common electrodes 08 of all pixel units are formed into a single plate-shaped structure; or, pixel electrodes 05 of respective pixel units may be arranged at an interval, and common electrodes 08 of respective pixel units may also be arranged at an interval.

In one embodiment, as shown in FIG. 7, when common electrodes 08 of all pixel units are formed into a single plate-shaped structure, the common electrode 08 is electrically connected with the common electrode line 15 in the display area through a fifth via hole 031. In this case, in the non-display area, when the common electrode leading-out line is located in the same layer as the source-drain electrode layer 06, the common electrode 08 is directly lapped over the common electrode leading-out line so as to be electrically connected with the common electrode leading-out line, and a voltage input to the common electrode from the common electrode line may be achieved without providing any via hole for electrically connect the common electrode with the common electrode line (that is, it is not required to provide the third via hole). Of course, the common electrode may also lap above or below the common electrode leading-out line in the non-display area so as to be electrically connected with the common electrode leading-out line.

In some examples, the common electrode line may include a third sub-connection line in the display area and a fourth sub-connection line in the non-display area. When the common electrode is located below the common electrode leading-out line, the fourth sub-connection line and the pixel electrode are arranged in a same layer. When the common electrode is located above the common electrode leading-out line, the fourth sub-connection line and the common electrode are arranged in a same layer. Correspondingly, the number of patterning processes for manufacturing the array substrate may be reduced, thereby simplifying the process of manufacturing the array substrate.

In one embodiment, the pixel electrode and the common electrode may also be located in a same layer. The array substrate according to embodiments of the present disclosure may also be applicable to an In-Plane Switching (IPS) structure. In this structure, the common electrode may be electrically connected with the common electrode leading-out line through the first via hole, and the common electrode line is electrically connected with the common electrode leading-out line through the second via hole.

An embodiment of the present disclosure further provides a display device, including the array substrate described in any of the above described embodiments. The display device may be a product or component having a display function, such as a liquid crystal display panel, an electronic paper, a mobile phone, a tablet computer, a television, a display, a notebook computer, a digital photo frame, a navigator or the like.

As described above, in the array substrate and the display device provided in the embodiments of the present disclosure, at least one row of common electrodes and/or at least one column of common electrodes are connected with one another and connected with the common electrode leading-out line, so that at least a connection way of connecting the common electrode in the display area of the array substrate with the common electrode leading-out line in the non-display area of the array substrate so as to achieve a voltage input to the common electrode, and it is not necessary to provide any via hole for connecting each common electrode with the common electrode line or the number of the via hole may be reduced (for example, no via hole is required when not providing any common electrode line), thereby reducing process complexity, increasing transmittance of the display area, optimizing a display effect of an image. Further, when the array substrate is provided with the common electrode line, the common electrode line and common electrode connection line are both used to input voltages to the common electrode, such that a stability in voltage of the common electrode is better, and a storage capacitor may be formed between the common electrode and the pixel electrode, improving the display effect of an image.

The above contents are only preferred embodiments of the present disclosure and are not intended to be limitative to the present disclosure, and various changes, alternatives, equivalents or modifications made without departing from the principle and spirit of the present disclosure shall fall within the scope of the present disclosure.

What is claimed is:

1. An array substrate, having a display area and a non-display area and comprising:
   a base substrate;
   a plurality of pixel units arranged in the display area on the base substrate and each comprising a common electrode and a pixel electrode;
   a common electrode leading-out line provided in the non-display area on the base substrate; and
   a common electrode connection line provided on the base substrate, directly connected with common electrodes of at least one row and/or at least one column of pixel units to interconnect the common electrodes of the at least one row and/or the at least one column of pixel units, and connected with the common electrode leading-out line.

2. An array substrate, having a display area and a non-display area and comprising:
   a base substrate;
   a plurality of pixel units arranged in the display area on the base substrate and each comprising a common electrode and a pixel electrode;
   a common electrode leading-out line provided in the non-display area on the base substrate; and
   a common electrode connection line provided on the base substrate to interconnect common electrodes of at least one row and/or at least one column of pixel units, and connected with the common electrode leading-out line,
   wherein the common electrodes and the common electrode connection line are provided in a same layer.

3. The array substrate according to claim 1, further comprising a common electrode line provided on the base substrate and electrically connected with a corresponding common electrode, the common electrode line being connected with the common electrode leading-out line.

4. The array substrate according to claim 3, wherein the common electrode leading-out line and the common electrode connection line are provided in different layers, and the common electrode connection line is connected with the common electrode leading-out line through a first via hole; and/or
   the common electrode leading-out line and the common electrode line are provided in different layers and the common electrode line is connected with the common electrode leading-out line through a second via hole.

5. The array substrate according to claim 3, wherein
   an orthographic projection of the first via hole on the base substrate at least partially overlaps an orthographic projection of the second via hole on the base substrate.

6. The array substrate according to claim 3, wherein
   each row of pixel units comprises a plurality of pixel unit groups each comprising at least two pixel units, and common electrodes of the at least one pixel units of each pixel unit group is connected with the common electrode line through a third via hole.

7. The array substrate according to claim 6, wherein
   the common electrodes of the at least two pixel units of at least one pixel unit group are formed into a single plate-shaped structure.

8. The array substrate according to claim 3, wherein
the common electrode connection line comprises a first sub-connection line in the display area and a second sub-connection line in the non-display area;
the common electrode line comprises a third sub-connection line in the display area and a fourth sub-connection line in the non-display area; and
the second sub-connection line, the fourth sub-connection line and the common electrode are arranged in a same layer.

9. The array substrate according to claim 3, wherein
the common electrode connection line comprises a first sub-connection line in the display area and a second sub-connection line in the non-display area;
the common electrode line comprises a third sub-connection line in the display area and a fourth sub-connection line in the non-display area;
the second sub-connection line and the common electrode are arranged in a same layer; and
the fourth sub-connection line and the pixel electrode are arranged in a same layer.

10. The array substrate according to claim 1, wherein
the pixel electrode is located above a plurality of data lines.

11. The array substrate according to claim 10, wherein each pixel unit is provided with at least one thin film transistor,
a second passivation layer is provided between the plurality of data lines and the pixel electrode, and the pixel electrode is connected with a source electrode or drain electrode of at least one said thin film transistor through a fourth via hole.

12. The array substrate according to claim 1, wherein
pixel electrodes of respective pixel units are arranged at an interval, and common electrodes of all pixel units are formed into a single plate-shaped structure; or
pixel electrodes of respective pixel units are arranged at an interval, and common electrodes of respective pixel units are arranged at an interval.

13. The array substrate according to claim 1, wherein
common electrodes of all pixel units are formed into a single plate-shaped structure provided in the display area or the non-display area, and
the common electrode is lapped above or below the common electrode leading-out line in the non-display area so as to be connected with the common electrode leading-out line.

14. The array substrate according to claim 13, wherein
the common electrode is located below the common electrode leading-out line, the pixel unit comprises a common electrode line electrically connected with a corresponding common electrode, and the common electrode line comprises a third sub-connection line in the display area and a fourth sub-connection line in the non-display area; and
the fourth sub-connection line and the pixel electrode are arranged in a same layer.

15. The array substrate according to claim 13, wherein
the common electrode is located above the common electrode leading-out line, the pixel unit comprises a common electrode line electrically connected with a corresponding common electrode, and the common electrode line comprises a third sub-connection line in the display area and a fourth sub-connection line in the non-display area; and
the fourth sub-connection line and the common electrode are arranged in a same layer.

16. The array substrate according to claim 1, wherein
the pixel electrode and the common electrode are located in a same layer.

17. The array substrate according to claim 1, wherein
the common electrode connection line is in direct contact with or is directly lapped over and connected with the common electrodes of the at least one row and/or the at least one column of pixel units.

18. The array substrate according to claim 1, wherein
the common electrode comprises a slit structure corresponding to at least one of the pixel units in the display area; and/or
the common electrode includes a hollowed-out structure lapping at least one of a gate line, a data line and a thin film transistor in the display area.

19. A display device, comprising the array substrate according to claim 1.

* * * * *